United States Patent [19]

Inoue

[11] Patent Number: 4,967,257
[45] Date of Patent: Oct. 30, 1990

[54] SEMICONDUCTOR DEVICE HAVING FIELD EFFECT TRANSISTORS

[75] Inventor: Yasuo Inoue, Hyogo, Japan

[73] Assignee: Mitsubishi Denki Kabushiki Kaisha, Tokyo, Japan

[21] Appl. No.: 301,402

[22] Filed: Jan. 19, 1989

[30] Foreign Application Priority Data

Jan. 29, 1988 [JP] Japan ................................ 63-020733

[51] Int. Cl.$^5$ ...................... H01L 27/02; H01L 29/78
[52] U.S. Cl. .................................... 357/42; 357/23.1; 357/41; 357/44
[58] Field of Search .................... 357/3, 23.4, 23.1, 41, 357/42, 64, 88, 44; 437/203

[56] References Cited

U.S. PATENT DOCUMENTS

| 4,835,584 | 5/1989 | Lancaster | 357/23.1 |
| 4,835,585 | 5/1989 | Panousis | 357/23.4 |
| 4,881,105 | 11/1989 | Davari et al. | 357/23.4 |

FOREIGN PATENT DOCUMENTS 0165356 7/1987 Japan ................................ 357/23.1

OTHER PUBLICATIONS

IBM Technical Disclosure Bulletin, vol. 29, No. 10, Trench Mosfets, Mar. 1987, pp. 4305–4307.
IEDM 85: "A Trench Transistor Cross-Point DRAM Cell", by W. F. Richardson et al, 29.6, 1985, pp. 714–717.

Primary Examiner—Rolf Hille
Assistant Examiner—Peter Toby Brown
Attorney, Agent, or Firm—Lowe, Price, LeBlanc, Becker & Shur

[57] ABSTRACT

A semiconductor device having field effect transistors (FETs) is provided. In the FET, a channel surface where a channel region and a gate electrode are opposed to each other is formed approximately vertical to a main surface of a substrate. A p type (n type) semiconductor region is formed on the main surface of the substrate, and a concave portion with a portion of side wall surfaces thereof being an exposed surface of the semiconductor region is formed. In the semiconductor region, n type (p type) drain and source regions are formed spaced apart from each other defining the channel region. A gate insulating layer is formed in the concave portion on the exposed surface of the semiconductor region on the channel region. A gate electrode is formed on the gate insulating layer in the concave portion. Consequently, the rate of the area occupied by one field effect transistor to the main surface of the substrate can be reduced. Therefore, a semiconductor device can be provided in which field effect transistors are integrated to a high degree without reducing channel length and without degrading performance of the transistors.

9 Claims, 11 Drawing Sheets

SEMICONDUCTOR DEVICE HAVING FIELD EFFECT TRANSISTORS

CROSS REFERENCE TO RELATED COPENDING APPLICATION

The related copending application of this application is U.S. Ser. No. 279,689 filed on Dec. 5, 1988 assigned to the same assignee.

BACKGROUND OF THE INVENTION

1. Field of the Invention

The present invention relates to semiconductor devices having field effect transistors and, more specifically, to semiconductor devices having field effect transistors with higher degree of integration. The present invention has particular utility in the field of gate arrays.

2. Description of the Background Art

Recently, there have been various types of LSIs (Large Scale Integrated Circuits) for specific or dedicated use, and different products are provided for different users. In other words, small numbers of various types of products must be provided, and various different manufacturing processes have been needed to provide various types of products for various users. Consequently, when we consider mask patterns employed during the manufacturing processes, for example, various patterns must be designed and various masks must be prepared corresponding to various products. Therefore, the time for developing and designing one LSI becomes longer and the manufacturing cost thereof is increased.

In view of the foregoing, gate arrays are proposed and have been commercially available which enable manufacturing of various types of semiconductor devices by changing only some steps of the manufacturing process. A gate array comprises gates which are called elemental cells arranged regularly (in an array) on an LSI chip. It is a semi-custom LSI designed by making the best use of CAD with the design, development and manufacturing process of a custom LSI being standardized to a large extent. Although the chip size of the gate array is increased compared with a full-custom LSI, the time for development and the manufacturing cost thereof can be reduced. Therefore, the gate arrays have been continuously improved and developed to provide higher performance and functions from the first actual application in early 1970's. The gate array comprises semiconductor elements shown in FIG. 1 repeatedly arranged regularly, and the gate array realizes a desired function only by determining a wiring pattern in accordance with a logic circuit diagram. Therefore, the gate array enables reduction of the designing cost, greatly reducing the time required for development, and it is suitable for providing small numbers of various types of products.

FIG. 1 is a schematic prospective view of an n channel MOS transistor constituting the gate array. Referring to the figure, the MOS transistor $Q_0$ comprises n type source 103 and drain 104 formed by diffusing n type impurities to a p type silicon substrate 2. A gate 106 formed of polysilicon is provided above a channel region 105 having a channel surface 105a formed between the source 103 and the drain 104, with a gate oxide layer (not shown) interposed therebetween. Other oxide layers and aluminum wirings are omitted in FIG. 1.

Since the n channel MOS transistor $Q_0$ constituting the conventional gate array is structured as described above, an area $S_1$ required for forming one n channel MOS transistor $Q_0$ will be approximately $$S_1 = (L_C + L_D + L_S) \times D_1 \tag{1}$$

as can be seen from FIG. 1. In the equation (1), the reference character $L_C$ represents a channel length, $L_D$ and $L_S$ represent the lengths of the drain 104 and the source 103 and $D_1$ represents a channel width.

Therefore, in order to improve the degree of integration of the transistors in the gate array, that is, to improve the degree of integration of the n channel MOS transistors $Q_0$ on the substrate 2, the n channel MOS transistor $Q_0$ itself must be made compact by reducing the channel length $L_C$, the lengths $L_D$ and $L_S$ of the drain 104 and the source 103 and the channel width $D_1$ of each n channel MOS transistor $Q_0$. However, when the n channel MOS transistor $Q_0$ itself is made compact, the electrical characteristics of the transistor is degraded. For example, when the channel length $L_C$ is reduced to minimize the size of the n channel MOS transistor $Q_0$, a short channel effect occurs, namely, the threshold voltage $V_{TH}$ of the MOS transistor reduces as the channel length becomes shorter. As the size of the MOS transistor is minimized, the MOS transistor shows undesired characteristics.

In order to solve the above described problem, one example of a semiconductor device capable of providing higher degree of integration without miniaturizing the transistor itself is disclosed in 1985, IEDM, Technical Digest, pp. 714–717, "A TRENCH TRANSISTOR CROSS-POINT DRAM CELL". FIG. 2 is a partial cross sectional view showing a cross sectional structure of such semiconductor device. Referring to FIG. 2, a dynamic memory cell is formed isolated by an isolating oxide layer 210 on a main surface of a p type silicon substrate 202. The dynamic memory cell comprises an n channel MOS transistor and a capacitor. The n channel MOS transistor has a drain 203 and a source 204 formed of n+ regions, a channel region 205 provided therebetween, and a gate electrode 206 formed on the channel region 205. The channel region 205 exists below a gate oxide layer 205a which is formed along a side wall portion of a trench formed on the main surface of the silicon substrate 202. The capacitor comprises a capacitor electrode 220 formed to be connected to the source 204 constituting the n channel MOS transistor and a capacitor oxide layer 230. The capacitor electrode 200 is formed of a polysilicon layer buried in the trench formed in the p type silicon substrate 202. The source 204 is provided in a ring around the capacitor electrode 220. The gate electrode 206 constituting the n channel MOS transistor is formed of polysilicon and it also serves as a word line.

In the dynamic memory cell shown in FIG. 2, a vertical n channel MOS transistor is formed on the side wall portion of the trench provided for the capacitor. By doing so, the horizontal area occupied by the n channel MOS transistor on the main surface of the substrate is reduced, but the transistor itself is not miniaturized and the performance of the transistor is maintained by forming the channel region on the side wall portion, for example.

However, in this structure, the source 204 is formed by diffusing impurities included in the n+ type polysilicon, which is buried in the trench to form the capacitor electrode 200, by thermal processing. Therefore, it is difficult to apply the structure shown in this prior art to a structure of a MOS transistor with the source region not connected to an electrode or the like constituting the capacitor. In addition, an undercut must be provided between the n+ type polysilicon buried in the trench and the p type silicon substrate 202, and the polysilicon must be buried again in the undercut portion to form the source 204. This makes the manufacturing process complicated. The channel region 205 is provided on the side wall of the trench formed in the p type silicon substrate 202. Therefore, the channel length is controlled by changing the time of etching carried out to form the trench. Therefore, adjustment of the channel length is more difficult compared with a normal case in which the channel is adjusted by mask patterns.

SUMMARY OF THE INVENTION

Therefore, one object of the present invention is to provide a semiconductor device in which the horizontal area occupied by a field effect transistor is reduced to improve the degree of integration of the field effect transistors.

Another object of the present invention is to provide a semiconductor device capable of reducing horizontal area occupied by the field effect transistors without degrading the performance of each of the field effect transistors itself.

A further object of the present invention is to provide a semiconductor device in which field effect transistors are integrated to a higher degree, with the channel length of each transistor being well adjusted.

A still further object of the present invention is to provide a semiconductor device having field effect transistors with vertical structures which can be easily manufactured.

A still further object of the present invention is to provide a gate array having high degree of integration of the field effect transistors.

A semiconductor device having field effect transistors in accordance with the present invention comprises a semiconductor substrate, first and second impurity regions of a second conductivity type, a gate insulating layer and a gate electrode. The semiconductor substrate has a main surface, a semiconductor region of a first conductivity type formed thereon and a concave portion with a portion of side wall surfaces thereof being an exposed surface of the semiconductor region. The first and second impurity regions are formed spaced apart from each other in the semiconductor region of the first conductivity type. The first and second impurity regions define a channel region having the surface of the exposed semiconductor region in the semiconductor region of the first conductivity type. The gate insulating layer is formed on the surface of the exposed semiconductor region on the channel region in the concave portion. The gate electrode is formed on the gate insulating layer in the concave portion.

According to a preferred embodiment of the present invention, the horizontal shape of the concave portion of the semiconductor substrate is approximately rectangular. The horizontal shape of the semiconductor region of the first conductivity type is approximately rectangular with one side opened. Preferably, the channel region is formed at the center of and the first and second impurity regions are formed on the opposing end portions of the approximately rectangular shape with one side opened. The gate electrode may comprise a conductive layer formed between and insulated from the first and second impurity regions, the layer being buried in the concave portion. The gate electrode may include an electrode portion positioned in the concave portion, and a contact portion formed extending from the electrode portion over the upper surface of the semiconductor region of the first conductivity type with an insulating layer interposed between, the contact portion having a surface electrically connected to a wiring layer.

A semiconductor device having a field effect transistor of a first conductivity type and a field effect transistor of a second conductivity type in accordance with another aspect of the present invention comprises a semiconductor substrate, first and second impurity regions of the second conductivity type, a first gate insulating layer, a first gate electrode, third and fourth impurity regions of the first conductivity type, a second gate insulating layer and a second gate electrode. The semiconductor substrate has a main surface, a first semiconductor region of the first conductivity type, a second semiconductor region of the second conductivity type arranged opposed to the first semiconductor region, and a concave portion with a portion of the side wall surface thereof being the exposed surfaces of the first and second semiconductor regions. The first and second impurity regions are formed spaced apart from each other in the first semiconductor region. The first and second impurity regions define a first channel region having the surface of the exposed first semiconductor region in the first semiconductor region. The first gate insulating layer is formed on the surface of the exposed first semiconductor region on the first channel region in the concave portion. The first gate electrode is formed on the first gate insulating layer in the concave portion. The third and fourth impurity regions are formed spaced apart from each other in the second semiconductor region. The third and fourth impurity regions define a second channel region having the exposed surface of the second semiconductor region in the second semiconductor region. The second gate insulating layer is formed on the exposed surface of the second semiconductor region in the second channel region in the concave portion. The second gate electrode is formed in the concave portion on the second gate insulating layer.

According to a preferred embodiment of the semiconductor device in accordance with further aspect of the present invention, the first gate electrode and second gate electrode comprise a common gate electrode in which the two electrodes are formed integrally. The common gate electrode may comprise an electrode portion positioned in the concave portion, and a contact portion formed extending from the electrode portion over the upper surfaces of the first and second semiconductor regions with an insulating film interposed therebetween, the contact portion having a surface electrically connected to a wiring layer.

A semiconductor device having field effect transistors in accordance with a still further aspect of the present invention comprises a plurality of field effect transistors arranged such that the gate electrodes are opposed to channel regions defined between the drains and sources, with the field effect transistors arranged in a matrix. The semiconductor device comprises a semiconductor substrate, first and second impurity regions, a gate insulating layer and a gate electrode, constituting the same structure as described above. A channel surface opposing to the gate electrode and defining the magnitude of the carrier path in the channel region is formed approximately vertical to the main surface of the semiconductor substrate.

In the present invention, the semiconductor region on which the channel region is to be formed is formed such that the surface thereof is exposed on the side wall surfaces of the concave portion. Therefore, the channel region is formed along the side wall surface of the concave portion, namely, the channel region is formed with the channel surface being approximately vertical to the main surface of the semiconductor substrate. Therefore, even if the transistors are highly integrated, the channel length is not reduced and the performance of the prescribed field effect transistor itself can be maintained. And therefore, the rate of the area occupied by one field effect transistor on the main surface of the semiconductor substrate can be substantially reduced while maintaining the performance of the field effect transistor. Consequently, the degree of integration of the field effect transistors can be improved. According to the semiconductor device of the present invention, the impurity regions constituting the field effect transistor can be formed in selfalignment, and therefore the channel length defined by the impurity regions can be easily controlled.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
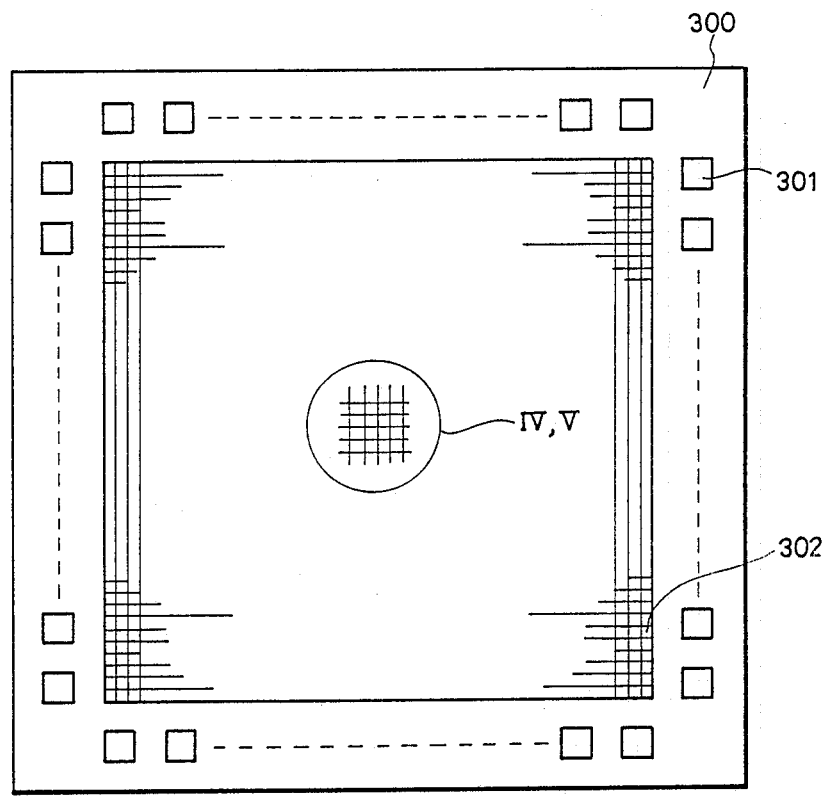
FIG. 3 is a plan view showing a schematic structure of a gate array as an example of a semiconductor device having field effect transistors in accordance with the present invention.

FIG. 3 is a plan view showing a whole structure of a gate array as one embodiment of the semiconductor device in accordance with the present invention. Referring to the figure, the gate array chip 300 comprises an input/output buffer and a pad region 301 arranged on the peripheral region thereof, and a region at the central portion in which elemental cells 302 are arranged. In the region on which the elemental cells 302 are to be arranged, a plurality of MOS transistors are formed. An enlarged view of the portions shown by IV or V of the region on which the elemental cells 302 are arranged is shown in FIGS. 4 or 5.

Figure 4:
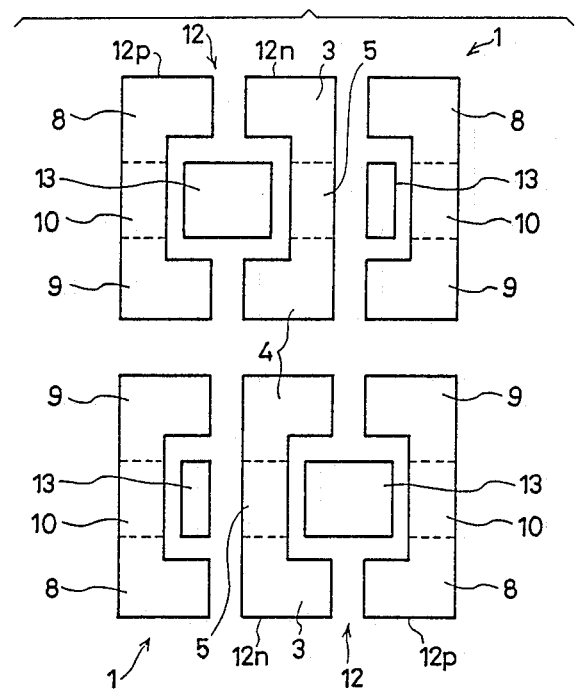
FIG. 4 is a plan view showing one embodiment of a semiconductor device having field effect transistors in accordance with the present invention.
Figure 5:
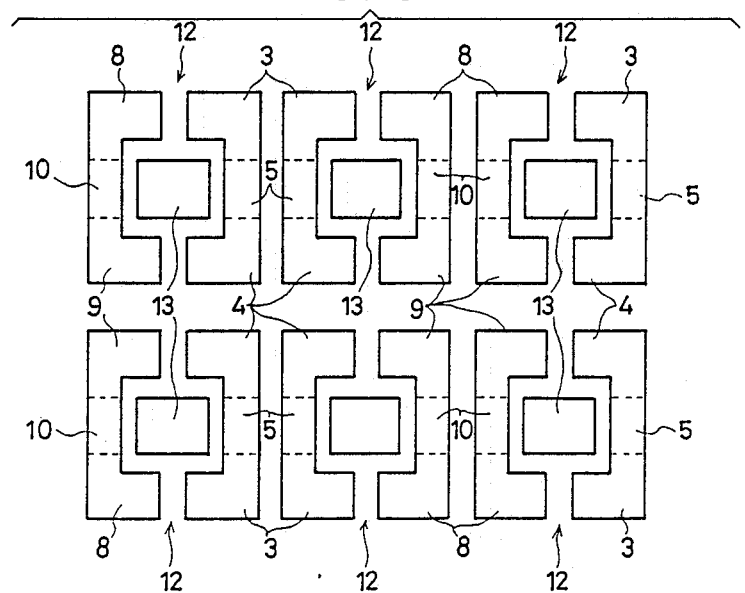
FIG. 5 is a plan view showing another embodiment of the semiconductor device having field effect transistors in accordance with the present invention.

FIG. 4 is a plan view showing an arrangement of the field effect transistors as one embodiment of the semiconductor device in accordance with the present invention. Referring to the figure, a p channel MOS transistor 1 is shown in a schematic perspective view of FIG. 6. A CMOS transistor 12 is shown in the schematic perspective view of FIG. 7. As shown in FIG. 4, a parallel arrangement of the p channel MOS transistors 1 and the CMOS transistors 12 are arranged spaced apart by a prescribed distance. FIG. 5 is a plan view showing another example of an arrangement of the field effect transistors constituting the semiconductor device in accordance with the present invention. In FIG. 5, CMOS transistors 12 are arranged spaced apart from each other by a prescribed distance.

Figure 6:
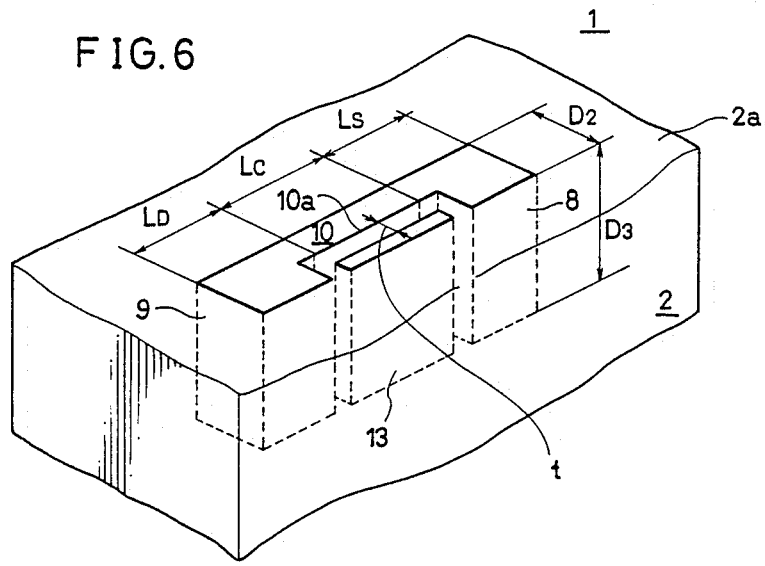
FIG. 6 is a schematic perspective view of a p channel MOS transistor constituting the semiconductor device of FIG. 4.
Figure 7:
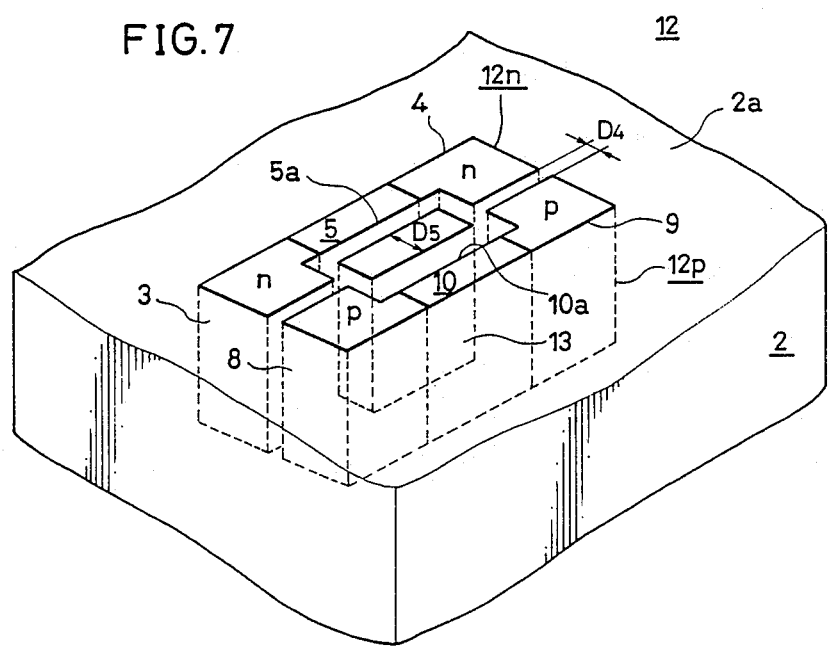
FIG. 7 is a schematic perspective view showing a CMOS transistor constituting the semiconductor device shown in FIGS. 4 and 5.

What is different from the conventional gate array is that in a p channel MOS transistor 1, the channel surface 10a defining the expansion of the carrier path in the channel region 10 is formed in a direction vertical to the main surface 2a of the substrate 2 as shown in FIG. 6, and that in the n channel MOS transistor 12n and p channel MOS transistor 12p, respective channel surfaces 5a and 10a defining the expansion of the carrier path in the channel regions 5 and 10 are formed parallel to each other and in the direction vertical to the main surface 2a of the substrate 2, as shown in FIG. 7. In addition, the gate 13 is formed extending in the direction vertical to the main surface 2a of the substrate 2. Further, the drains 4, 9 and sources 3, 8 are formed extending in the direction vertical to the main surface 2a of the substrate 2.

Figure 1:
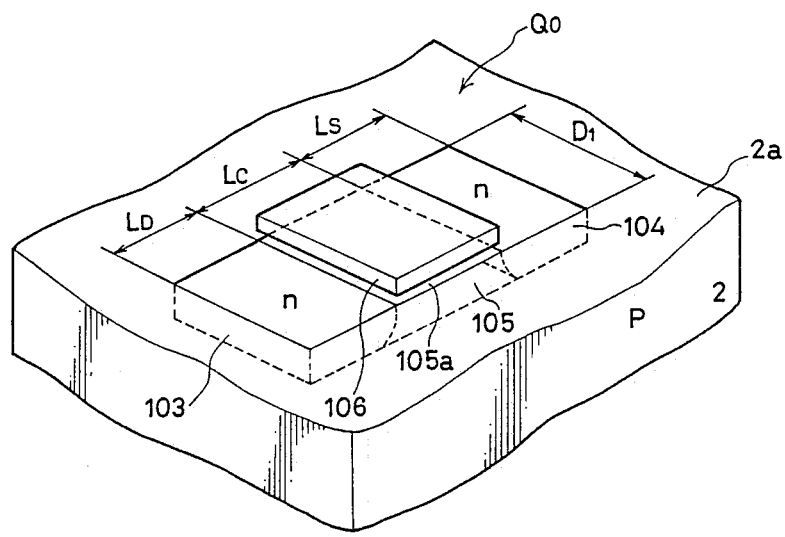
FIG. 1 is a schematic perspective view showing a field effect transistor constituting a conventional semiconductor device.
Figure 2:
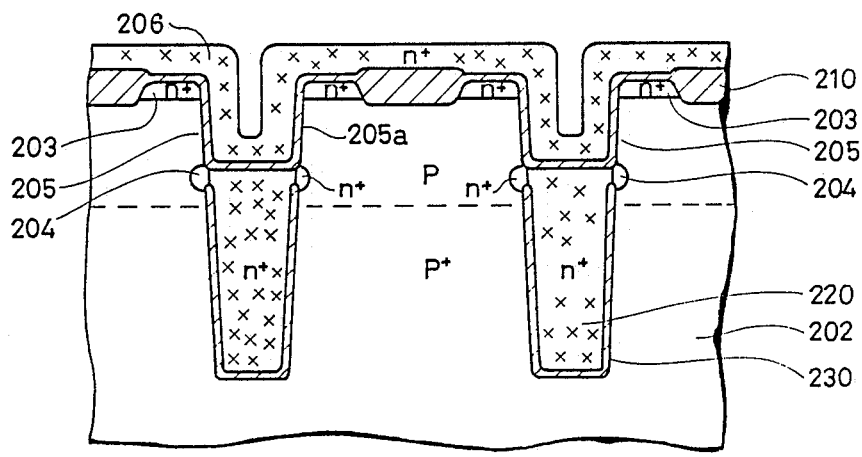
FIG. 2 is a partial cross sectional view showing one example of a semiconductor device comprising a conventional vertical field effect transistor.

By structuring as described above, the area of the gate array can be reduced. Referring to FIG. 6, the area $S_2$ required for forming the p channel MOS transistor 1 will be approximately $$S_2 = (L_C + L_D + L_S) \times D_2 \qquad (2)$$

where the width of the source 8 and the drain 9 on the main surface 2a are represented by $D_2$, for example. Since the width $D_2$ in the equation (2) is considerably smaller than the channel width $D_1$ in the equation (1) disclosed in the description of the prior art, the area $S_2$ on the main surface 2a of the substrate 2 occupied by the p channel MOS transistor 1 is very small compared with the conventional n channel MOS transistor Q₀ (FIG. 1). Therefore, the transistors can be highly integrated without miniaturizing each of the transistors 1, 12p, 12n constituting the gate array. In other words, the degree of integration of the transistors can be improved without shortening the channel length $L_C$, while maintaining the prescribed performance of the MOS transistor.

A method for manufacturing the n channel MOS transistor having the structure shown in FIG. 6 will be described in the following. FIGS. 8A to 8H are plan views showing the method for manufacturing the n channel MOS transistor having the structure shown in FIG. 6 in the order of the manufacturing steps, and FIGS. 9A to 9H are partial cross sectional views showing cross sections taken along the lines IX—IX in FIGS. 8A to 8H. The manufacturing steps will be described with reference to these figures.

Figure 8A:
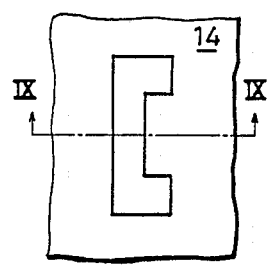
FIGS. 8A, 8B, 8C, 8D, 8E, 8F, 8G and 8H are plan views showing a method for manufacturing an n channel MOS transistor having the structure shown in FIG. 6 in the order of manufacturing steps.
Figure 8B:
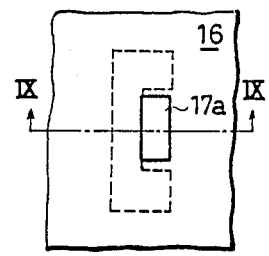
Figure 9A:
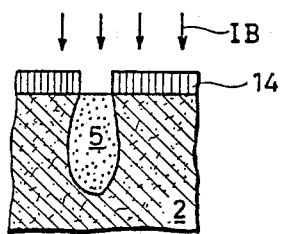
FIGS. 9A, 9B, 9C, 9D, 9E, 9F, 9G and 9H are partial cross sectional views showing the cross sections taken along the lines IX—IX of the plan views shown in FIGS. 8A to 8H.
Figure 9B:
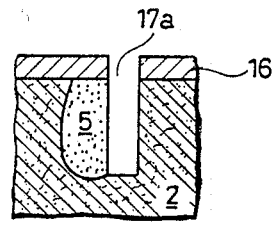

First, referring to FIGS. 8A and 9A, boron is ion implanted as p type impurities in the direction shown by the arrow IB in a region on which the drain 4, source 3 and the channel region 5 (shown in FIG. 7) are to be formed, using a resist 14 applied on a p type silicon substrate as a mask. The boron is implanted so as to control the threshold voltage of the MOS transistor to provide a prescribed value. The implantation of boron at this time is carried out with the accelerating voltage of the boron ion beam IB changed by several steps in order to control the distribution of boron in the depth direction (hereinafter referred to as multi-stage-voltage implantation). Referring to FIGS. 8B and 9B, the resist 14 is removed, a silicon oxide layer 16 is formed on the upper surface of the substrate 2 and a region on which a gate 6 is to be formed is selectively etched to form a trench 17a. The position of the trench 17a is selected such that the trench 17a is in direct contact with the channel region 5, namely, the trench 17a exposes the surface of the channel region 5.

Figure 8C:
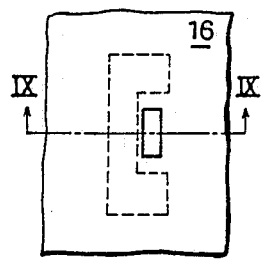
Figure 8D:
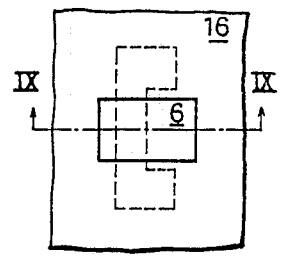
Figure 9C:
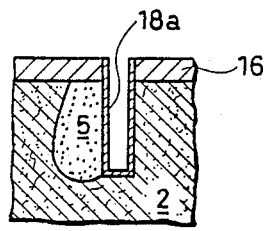
Figure 9D:
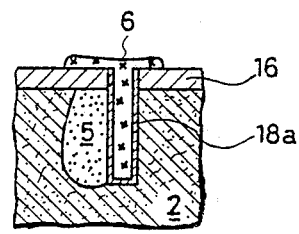

As is shown in FIGS. 8C and 9C, after the formation of the trench 17a, a silicon oxide layer 18a is formed on inner wall surfaces of the trench 17a. A portion of this silicon oxide layer 18a that which is formed on the side of the channel region 5 will be the gate oxide layer of the MOS transistor. Thereafter, as shown in FIGS. 8D and 9D, a gate electrode material such as doped polysilicon is deposited on the upper portion of the substrate 2 (including the inside of the trench 17a) by the chemical vapor deposition method (CVD method) and thereafter patterning is carried out selectively by employing the photolithographic technique to form the gate 6. As is apparent from the figures, the gate 6 is formed on the silicon oxide layer 16 to cover the channel region 5.

Figure 8E:
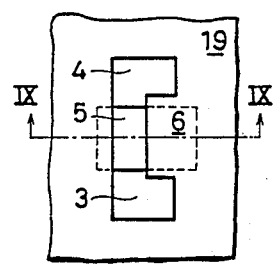
Figure 8F:
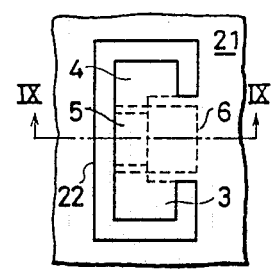
Figure 9E:
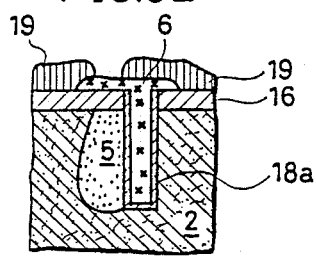
Figure 9F:
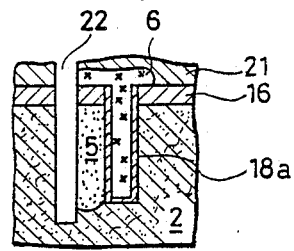

Referring to FIGS. 8E and 9E, a resist 19 is applied on the entire surface, and only those regions on which the drain 4, source 3 and the channel region 5 are to be formed are opened by patterning. Thereafter, phosphorus is ion implanted by multi-stage-voltage implantation as n type impurities to the regions on which the drain 4 and the source 3 are to be formed by selfalignment using the resist 19 and the gate 6 as masks. Since the source 3 and the drain 4 are formed by selfalignment using the resist 19 and the gate 6 as masks as described above, the regions of the source 3 and the drain 4 can be formed without misalignment in association with the channel region 5, regardless of the precision of registration of the resist 19. Thereafter, referring to FIGS. 8F and 9F, a silicon oxide layer 21 is further formed on the entire surface. The silicon oxide layer 21 is selectively etched around the drain 4, source 3 and the channel region 5 to form a trench 22 for isolating elements.

Figure 8G:
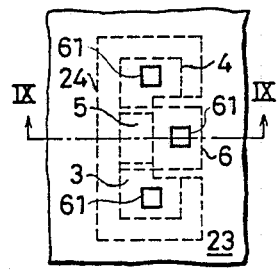
Figure 8H:
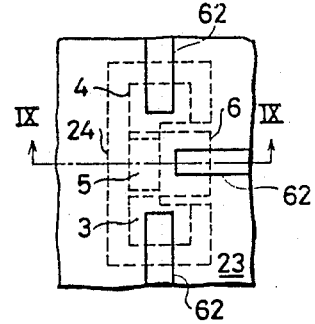
Figure 9G:
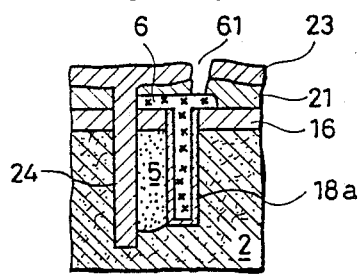
Figure 9H:
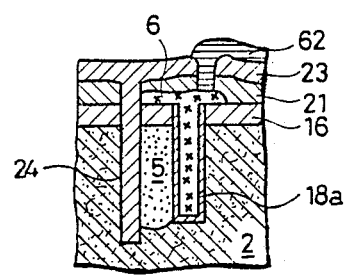

As shown in FIGS. 8G and 9G, a silicon oxide layer 23 is again formed on the entire surface by thermal oxidation or the CVD method. Consequently, the silicon oxide layer 23 is filled in the trench 22, thereby forming an isolating region 24. Thereafter, contact holes 61 are formed by photolithography to reach the surfaces of the drain 4, source 3 and the gate 6, respectively. As shown in FIGS. 8H and 9H, aluminum wirings 62 are formed so as to be connected to the gate 6, the source 3 and the drain 4, respectively, through the contact holes 61. Finally, a protective layer (not shown) is formed on the upper surface thereof.

An n channel MOS transistor is formed in this manner.

FIGS. 10A to 10I are plan views showing, in the order of the manufacturing steps, the method for manufacturing the CMOS transistor shown in FIG. 7, which is another embodiment of the present invention. FIGS. 11A to 11I are cross sectional views taken along the lines XI—XI of these figures. The manufacturing method will be described with reference to these figures.

Figure 10A:
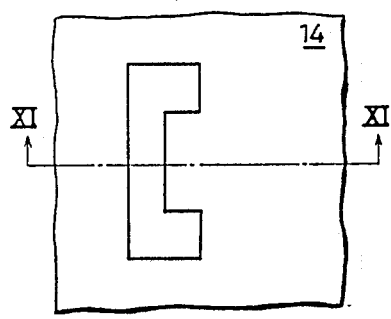
FIGS. 10A, 10B, 10C, 10D, 10E, 10F, 10G, 10H and 10I are plan views showing the method for manufacturing the CMOS transistor shown in FIG. 7 in the order of the manufacturing steps.
Figure 10B:
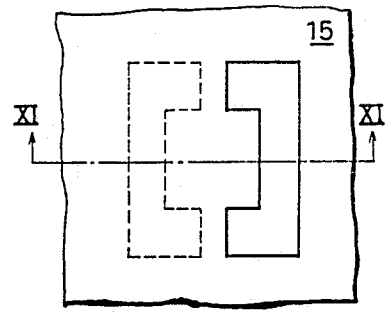
Figure 11A:
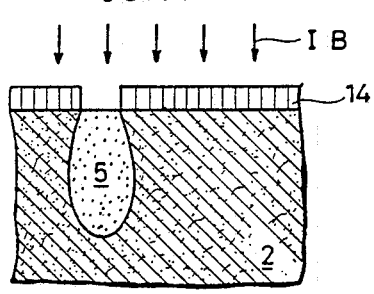
FIGS. 11A, 11B, 11C, 11D, 11E, 11F, 11G, 11H and 11I are partial cross sectional views showing the cross sections taken along the lines XI—XI of the plan views shown in FIGS. 10A to 10I.
Figure 11B:
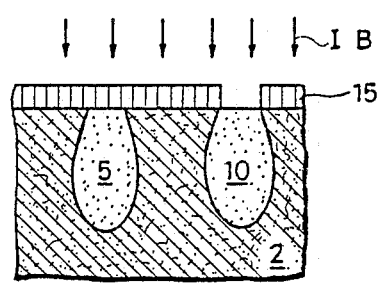

First, as shown in FIGS. 10A and 11A, boron as p type impurities is ion implanted in the direction shown by an arrow IB in those regions on which the drain 4, source 3 and the channel region 5 constituting the n channel MOS transistor 12n are to be formed, using a resist 14 applied on a p type silicon substrate 2 as a mask. The resist 14 is removed and, thereafter, a resist 15 is applied as shown in FIGS. 10B and 11B. Phosphorus as n type impurities is ion implanted in the direction shown by the arrow IB to those regions on which the drain 9, source 8 and the channel region 10 constituting a p channel MOS transistor 12b are to be formed, using the resist 15 as a mask. The implantation of boron or phosphorus on this occasion is carried out by multi-stage-voltage implantation to control the distribution of boron (phosphorus) in the depth direction.

Figure 10C:
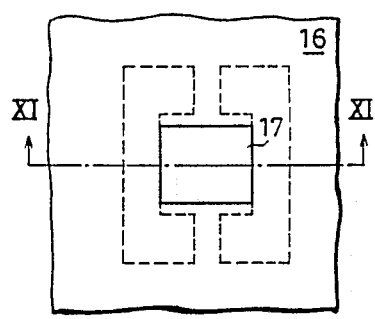
Figure 10D:
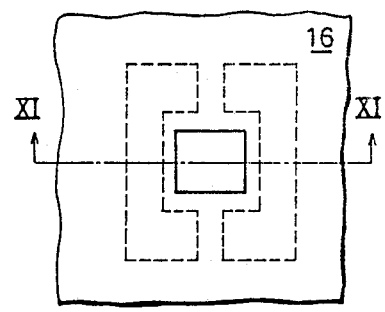
Figure 11C:
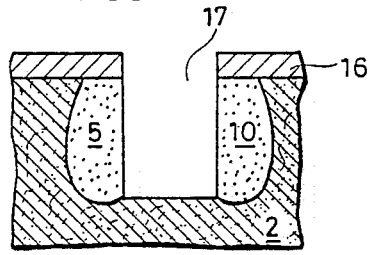
Figure 11D:
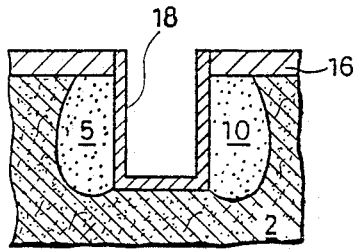

Referring to FIGS. 10C and 11C, the resist 15 is removed and, thereafter, a silicon oxide layer 16 is formed on an upper surface of the substrate 2. Selective etching is carried out on that region on which the gate is to be formed to form a trench 17. The position of the trench 17 is determined such that the trench 17 is in direct contact with the channel regions 5 and 10, that is, the trench 17 exposes the surfaces of the channel regions 5 and 10. After the formation of the trench 17, a silicon oxide layer 18 is formed on the inner wall surfaces of the trench 17, as shown in FIGS. 10D and 11D. Those portions of the silicon oxide layer 18 which are formed on the sides of the channel regions 5 and 10 will be gate oxide layers of the CMOS transistor.

Figure 10E:
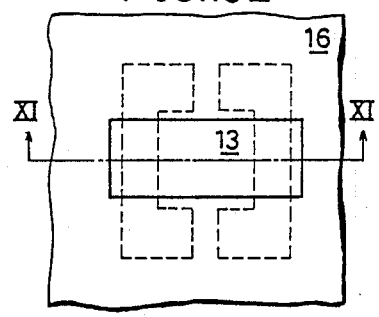
Figure 10F:
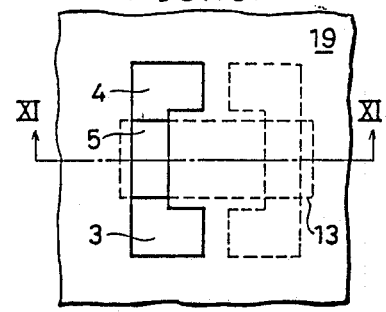
Figure 11E:
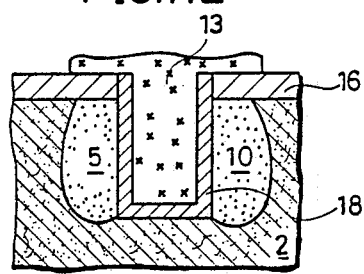
Figure 11F:
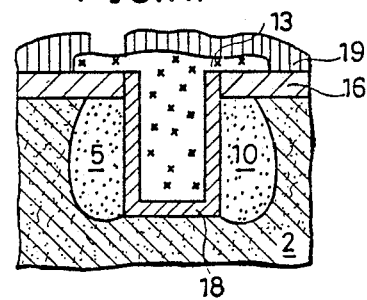

Thereafter, as shown in FIGS. 10E and 11E, doped polysilicon is deposited on the upper portion of the substrate 2 (including the inside of the trench 17) by the CVD method, and selective patterning is carried out by photolithography to form the gate 13. As is apparent from the figure, the gate 13 is formed on the silicon oxide layer 16 to cover the channel regions 5 and 10. Referring to FIGS. 10F and 11F, a resist 19 is applied on the entire surface, and only those regions on which the drain 4, the source 3 and the channel region 5 are to be formed are opened by patterning. Phosphorus as n type impurities is multi-stage-voltage implanted only to those regions on which the drain 4, and the source 3 of the n channel MOS transistor are to be formed by selfalignment using the resist 19 and the gate 13 as masks.

Figure 10G:
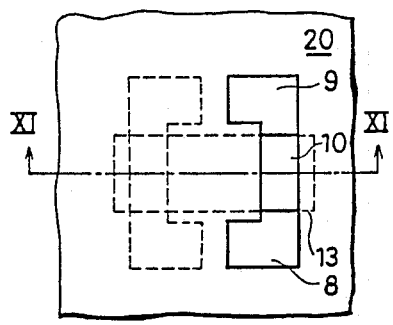
Figure 11G:
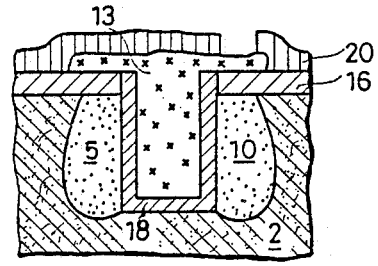

Thereafter, the resist 19 is removed and a resist 20 is applied on the entire surface as shown in FIGS. 10G and 11G, and only those regions on which the drain 9, the source 8 and the channel region 10 are to be formed are opened by patterning. Boron as p type impurities is implanted by multi-stage-voltage implantation only to those regions on which the drain 9 and the source 8 of the p channel MOS transistor are to be formed by selfalignment using the resist 20 and the gate 13 as masks. Since the formation of the drains 4 and 9 and of the sources 3 and 8 by multi-stage-voltage implantation of phosphorus and boron is carried out by selfalignment using the resists 19 and 20 and the gate 13 as masks, there will be no misalignment of the drains 4 and 9 and of the sources 3 and 8 in association with the channel regions 5 and 10 caused by misregistration of the mask of the resist 19 or the resist 20. Therefore, even if the degree of integration is improved, the electrical characteristics of the CMOS transistor 12 is not degraded. The formation of the drain and source by selfalignment is also carried out in the manufacturing process of the n channel MOS transistors shown in FIGS. 8E and 9E.

Now, in this embodiment, the drains 4 and 9 and the sources 3 and 8 must be formed relatively deep. Therefore, the expansion of the implanted phosphorus and boron in the horizontal direction (especially the expansion in the direction to the channel regions 5 and 10) must be controlled, preventing the influence to the electrical characteristics of the CMOS transistor 12. The control is carried out by multi-stage-voltage implantation in accordance with the relations between the expansions of the phosphorus and boron in the horizontal direction, the depth of implantation, the accelerating voltage of the ion beams of phosphorus and boron which were previously examined by experiments and so on. When the drain 9 and the source 8 are to be formed with the channel width of about 1μm, namely, the implanting depth of boron of that size by implanting boron, for example, the multi-stage-voltage implantation must be carried out at four different accelerating voltages, that is, 400 keV (the length of invasion is 0.899μm), 240 keV (the length of invasion is 0.611μm), 120 keV (the length of invasion is 0.350μm) and 50 keV (the length of invasion is 0.161μm). By doing so, the drain 9 and the source 8 have uniform distribution of boron over the length of about 1μm.

Figure 10H:
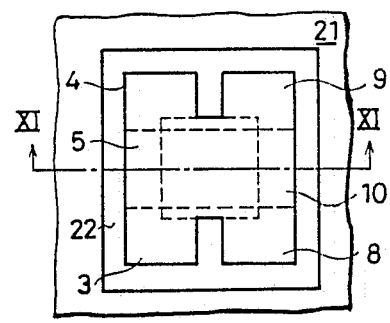
Figure 11H:
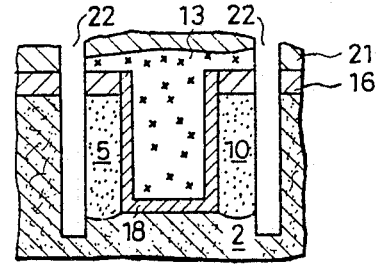
Figure 10I:
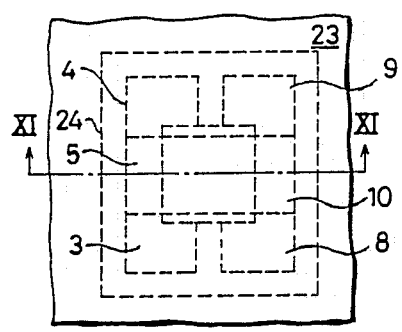
Figure 11I:
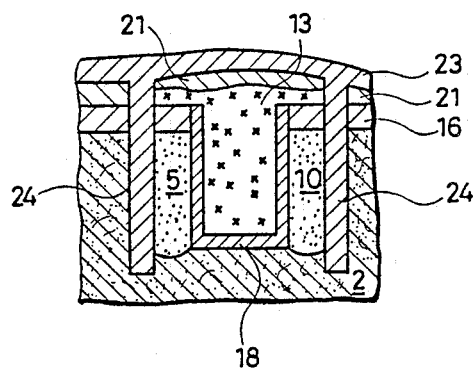

Thereafter, as shown in FIGS. 10H and 11H, the resist 20 is removed and a silicon oxide layer 21 is formed on the entire surface. Selective etching is carried out around the drains 4, 9, the sources 3, 8 and the channel region 5, 10 to form a trench 22 for isolating elements. Referring to FIGS. 10I and 11I, a silicon oxide layer 23 is again formed on the upper portion of the substrate 2 by thermal oxidation or the CVD method. Consequently, the silicon oxide layer 23 is also filled in the trench 22 to form an isolating region 24. Although not shown, the aluminum wirings respectively connected to the drains 4, 9, the sources 3, 8 and the gate 13 are formed in the similar manner as shown in FIGS. 8H and 9H through contact holes.

The CMOS transistor shown in FIG. 7 is manufactured through the above described steps.

As an example of the MOS transistor structured in the above described manner, a MOS transistor having the following dimensions can be provided. Referring to FIGS. 6 and 7, $L_D = L_C = L_S = 1.0\mu m$, $D_2 = D_3 = 1.0\mu m$ $D_4 = 0.5\mu m$, $D_5 = 1.0\mu m$, $t = 200Å$ The impurity concentration of the semiconductor substrate is up to about $10^{15}/cm^3$, the impurity concentration of the channel region is up to about $10^{16}/cm^3$ and the impurity concentration of the source and drain is up to about $10^{20}/cm^3$, in that case.

Figure 12:
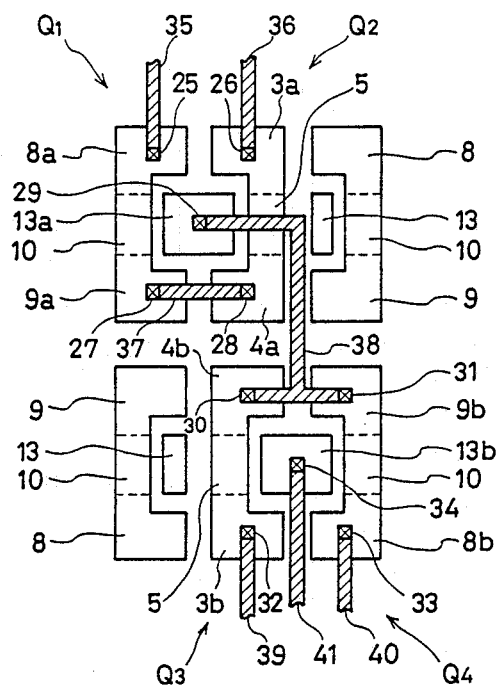
FIG. 12 is a plan view showing an application of the semiconductor device shown in FIG. 4.

One application of the semiconductor device shown in FIG. 4 will be described in the following with reference to FIGS. 12 and 13. In order to simplify the description, the reference character $Q_1$ represents a p channel MOS transistor comprising a source 8a, a drain 9a and a gate 13a. The reference character $Q_2$ represents an n channel MOS transistor comprising a source 3a, a drain 4a and a gate 13a. The reference numeral $Q_3$ represents an n channel MOS transistor comprising a source 3b, a drain 4b and a gate 13b. The reference character $Q_4$ represents a p channel MOS transistor comprising a source 8b, a drain 9b and a gate 13b. In FIG. 12, the numerals 25 to 34 represent contact holes. The source 8a and the wiring 35 are connected to each other through the contact hole 25 and the supply potential Vcc is supplied to the source 8a. The source 3a of the n channel MOS transistor $Q_2$ is connected to the wiring 36 through the contact hole 26 to supply the ground potential GND to the source 3a. The drains 4a and 9a are connected by the wiring 37 through the contact holes 28 and 27. The gate 13a and the drains 4b and 9b are connected by the wiring 38 through the contact holes 29, 30 and 31. The source 3b and the wiring 39 are connected to each other through the contact hole 32 so that the ground potential GND is supplied to the source 3b. The source 8b is connected to the wiring 40 through the contact hole 33, so that the supply potential Vcc is supplied to the source 8b. The gate 13b and the wiring 41 are connected through the contact hole 34 to receive a control input. An equivalent circuit of the semiconductor device structured as described above is shown in FIG. 13.

Figure 13:
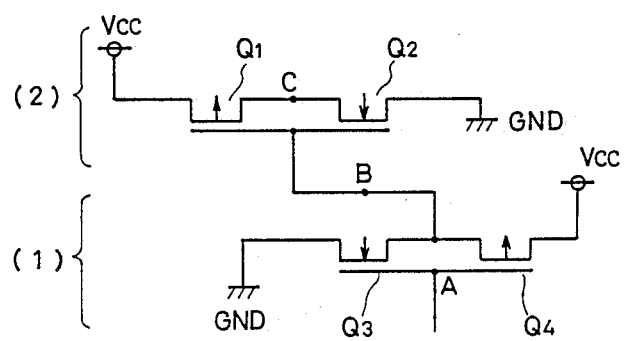
FIG. 13 is a schematic diagram showing an equivalent circuit of FIG. 12.

As shown in FIG. 13, the circuit structured as described above comprises a lower inverter (1) and an upper inverter (2) connected to each other. The operation of the circuit will be described in the following. when a high voltage is applied to a point A which corresponds to the gate of the inverter (1), a p channel MOS transistor $Q_4$ of the inverter (1) turns off and an n channel MOS transistor $Q_3$ turns on. Consequently, the potential at a common drain (point B) of the p channel MOS transistor $Q_4$ and the n channel MOS transistor $Q_3$ constituting the inverter (1) becomes low. The low level potential at the point B is applied to the gate of the upper inverter (2), whereby a p channel MOS transistor $Q_1$ of the inverter (2) turns on and an n channel MOS transistor $Q_2$ turns off. Therefore, the potential at the common drain (point C) becomes high level.

On the contrary, when a low level potential is supplied to the point A, the common drain (point B) of the inverter (1) becomes high level, and the reverse operation is carried out. The circuit may be used as a buffer for shaping waveforms, as an inverter chain or an oscillator.

Figure 14:
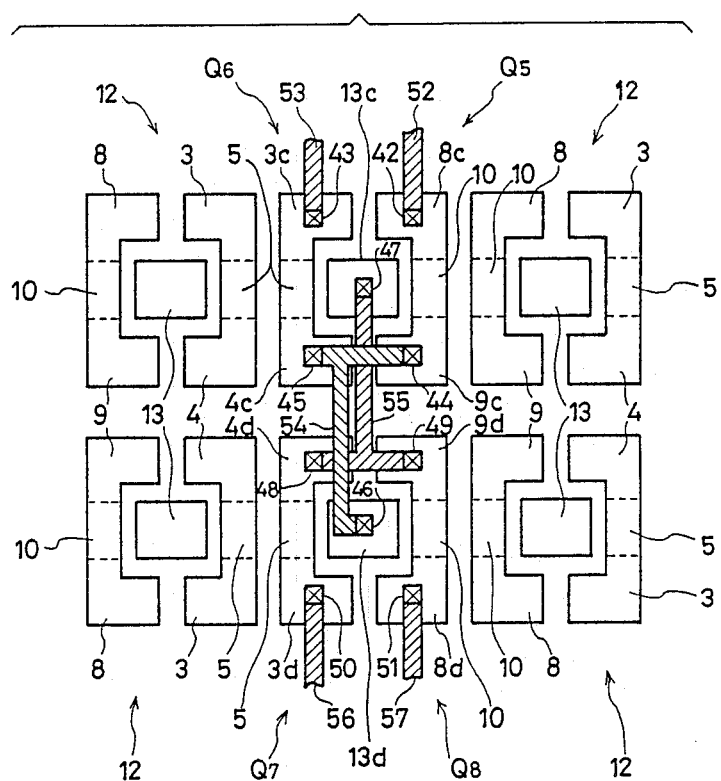
FIG. 14 is a plan view showing an application of the semiconductor device shown in FIG. 5.
Figure 15:
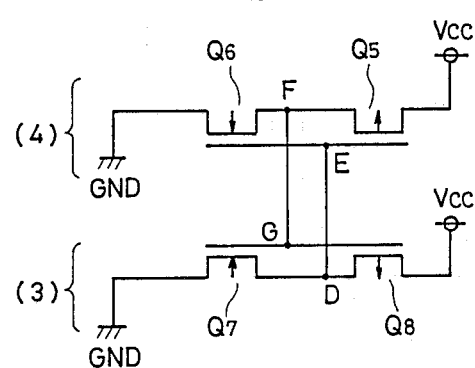
FIG. 15 is a schematic diagram showing an equivalent circuit of FIG. 14.

One application of the semiconductor device shown in FIG. 5 will be described with reference to FIGS. 14 and 15. The structure of the transistors are as follows. The reference character $Q_5$ represents a p channel MOS transistor comprising a source 8c, a drain 9c and a gate 13c. The reference character $Q_6$ represents an n channel MOS transistor comprising a source 3c, a drain 4c and a gate 13c. The reference character $Q_7$ represents an n channel transistor comprising a source 3d, a drain 4d and a gate 13d. The reference character $Q_8$ represents a p channel MOS transistor comprising a source 8d, a drain 9d and a gate 13d. In FIG. 14, reference numerals 42 to 51 represent contact holes, and the source 8c and wiring 52 are connected through the contact hole 42 to supply the supply potential Vcc to the source 8c. The source 3c is connected to the wiring 53 through the contact hole 43, and the ground potential GND is supplied to the source 3c. The drains 4c, 9c and the gate 13d are connected by the wiring 54 through contact holes 45, 44 and 46. The gate 13c and the drains 4d and 9d are connected by the wiring 55 through the contact holes 47 to 49. The source 3d is connected to the wiring 56 through the contact hole 50, and the ground potential GND is supplied to the source 3d. In addition, the source 8d is connected to the wiring 57 through the contact hole 51, and the supply potential Vcc is supplied to the source 8d. An equivalent circuit of the semiconductor substrate structured as described above is shown in FIG. 15.

The circuit structured as described above represents a portion of a flip flop in which one gate of the two inverters (3) and (4) is connected to a common drain of the other one of the inverters. The operation of the circuit will be described in the following. For example, when the potential at the common drain (point D) of the lower inverter (3) is set at a high level, the potential at the gate (point E) of the upper inverter (4) also becomes high level. Consequently, the n channel MOS transistor $Q_6$ of the upper inverter (4) turns on and the p channel MOS transistor $Q_5$ turns off. On this occasion, the potential at the common drain (point·F) of the upper inverter (4) becomes low level, which potential in turn applied to the gate (point G) of the lower inverter (3). Therefore, the p channel MOS transistor $Q_8$ of the lower inverter (3) turns on and the n channel MOS transistor $Q_7$ turns off. Consequently, the potential of the common drain (point D) becomes high level. Therefore, even if the high level voltage initially applied to the point D is removed, the high level potential is maintained at the point D.

On the contrary, when a low level voltage is applied to the point D, the potential of the low level is maintained at the point D even if the externally applied voltage is removed.

Such operation can be used for a memory cell of a static RAM.

Although description was given of a case in which two types of transistors, namely, n channel MOS transistor and p channel MOS transistor are used as the field effect transistors constituting the semiconductor device in the above embodiment, the present invention can also be applied when the device is structured only by n channel MOS transistors or by p channel MOS transistors.

As described above, according to the present invention, the channel surface and the gate electrode are formed vertical to the main surface of the substrate, whereby the horizontal area occupied by one field effect transistor on the main surface can be reduced. Therefore, a semiconductor device can be provided which has field effect transistors integrated to a higher degree without degrading electrical performance of the transistor, without miniaturizing each of the field effect transistors itself. In addition, since the channel region is formed in selfalignment in accordance with the manufacturing method of the present invention, the channel length can be easily controlled.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an array of elemental cells, each of said elemental cells comprising:
    a semiconductor substrate having a main surface, a first semiconductor region of a first conductivity type, a second semiconductor region of a second conductivity type positioned opposed to the first semiconductor region, and a trench formed in said semiconductor substrate, wherein a portion of side wall surface of said trench includes exposed surfaces of said first and second semiconductor regions; first and second impurity regions of the second conductivity type formed spaced apart from each other in said first semiconductor region, said first and second impurity regions defining in said first semiconductor region a first channel region including said exposed surface of said first semiconductor region;
    a first gate insulating layer formed in said trench on said exposed surface of the first semiconductor region of said first channel region;
    a first gate electrode formed in said trench on said first gate insulating layer;
    third and fourth impurity regions of the first conductivity type formed spaced apart from each other in said semiconductor region, said third and fourth impurity regions defining in said second semiconductor region a second channel region including said exposed surface of said second semiconductor region;
    a second gate insulating layer formed in said trench on said exposed surface of said second semiconductor region of said second channel region; and
    a second gate electrode formed in said trench on said second gate insulating layer.

2. A semiconductor device according to claim 1, wherein said first gate electrode and said second gate electrode comprise a common gate electrode in which the gate electrodes are formed integrally.

3. A semiconductor device according to claim 2, wherein
    said common gate electrode comprises an electrode portion positioned in said trench, and a contact portion formed extending from the electrode portion over upper surfaces of said first semiconductor region and said second semiconductor region, wherein an insulating layer is interposed between said contact portion and said upper surfaces of said first semiconductor region and said second semiconductor region, said contact portion having a surface electrically connected to a wiring layer.

4. A semiconductor device according to claim 1, wherein
    said trench formed in said semiconductor substrate is approximately rectangular;

said first semiconductor region is approximately rectangular with one opened side, said first channel region formed at the center of and said first and second impurity regions formed on opposing end portions of the one opened side of said first semiconductor region;

said second semiconductor region is approximately rectangular with one opened side, said second channel region formed at the center of and said third and fourth impurity regions formed on opposing end portions of the one opened side of said second semiconductor region; and said first gate electrode and said second gate electrode comprise a conductive layer formed in a region surrounded by said first semiconductor region and said second semiconductor region, said conductive layer being insulated therefrom and buried in said trench.

5. A semiconductor device according to claim 1, wherein first and second channel surfaces for respectively defining a magnitude of a carrier path in said first and second channel regions are formed in planes that are approximately perpendicular to the main surface of said semiconductor substrate.

6. A semiconductor device having an array of elemental cells, each of said elemental cells comprising:
a semiconductor substrate having a main surface;
a first semiconductor region of a first conductivity type and a first trench formed in said semiconductor substrate, wherein a portion of side wall surfaces of said first trench includes an exposed surface of said first semiconductor region;
first and second impurity regions of a second conductivity type formed spaced apart from each other in said first semiconductor region, said first and second impurity regions defining a first channel region in said first semiconductor region including said exposed surface of said first semiconductor region;
a first gate insulating layer formed in said first trench on said exposed surface of said first semiconductor region of said first channel region;
a first gate electrode formed in said first trench on said first gate insulating layer;
a second semiconductor region of the first conductivity type, a first side of said second semiconductor region being positioned approximately parallel to said first semiconductor region, a third semiconductor region of the second conductivity type positioned opposed to a second side of said second semiconductor region which is opposite from said first side, and a second trench formed in said semiconductor substrate, wherein a portion of side wall surface of said second trench includes exposed surfaces of said second and third semiconductor regions;
third and fourth impurity regions of the second conductivity type formed spaced apart from each other in said second semiconductor region, said third and fourth impurity regions defining in said second semiconductor region a second channel region including said exposed surface of said second semiconductor region;

a second gate insulating layer formed in said second trench on said exposed surface of the second semiconductor region of said second channel region;
a second gate electrode formed in said second trench on said second gate insulating layer;
fifth and sixth impurity regions of the first conductivity type formed spaced apart from each other in said third semiconductor region, said fifth and sixth impurity regions defining in said third semiconductor region a third channel region including said exposed surface of said third semiconductor region;
a third gate insulating layer formed in said concave portion on said exposed surface of said third semiconductor region of said third channel region; and
a third gate electrode formed in said second trench on said third gate insulating layer;
wherein first, second and third channel surfaces for respectively defining a magnitude of a carrier path in said first, second and third channel regions are formed in planes that are approximately perpendicular to the main surface of said semiconductor substrate.

7. A semiconductor device according to claim 6, wherein said second gate electrode and said third gate electrode comprise a common gate electrode in which the gate electrodes are formed integrally.

8. A semiconductor device according to claim 7, wherein said common gate electrode comprises an electrode portion positioned in said second trench, and a contact portion formed extending from the electrode portion over upper surfaces of said second semiconductor region and said third semiconductor region, wherein an insulating layer is interposed between said contact portion and said upper surfaces of said second semiconductor region and said third semiconductor region, said contact portion having a surface electrically connected to a wiring layer.

9. A semiconductor device according to claim 6, wherein
said first and second trenches formed in said semiconductor substrate are approximately rectangular;
said first semiconductor region is approximately rectangular with one opened side, said first channel region formed at the center of and said first and second impurity regions formed on opposing end portions of the one opened side of said first semiconductor region;
said second semiconductor region is approximately rectangular with one opened side, said second channel region formed at the center of and said third and fourth impurity regions formed on opposing end portions of the one opened side of said second semiconductor region;
said third semiconductor region is approximately rectangular with one opened side, said third channel region formed at the center of and said fifth and sixth impurity regions formed on opposing end portions of the one opened side of said third semiconductor region; and
said second gate electrode and said third gate electrode comprise a conductive layer formed in a region surrounded by said second semiconductor region and said third semiconductor region, said layer being insulated therefrom and buried in said second trench.

* * * * *